US006680655B2

(12) United States Patent
Rogers

(10) Patent No.: US 6,680,655 B2
(45) Date of Patent: Jan. 20, 2004

(54) AUTOMATIC GAIN CONTROL FOR A VOLTAGE CONTROLLED OSCILLATOR

(75) Inventor: John William Mitchell Rogers, Ottawa (CA)

(73) Assignee: Sige Semiconductor Inc., Ottawa (CA)

(*) Notice: Subject to any disclaimer, the term of this patent is extended or adjusted under 35 U.S.C. 154(b) by 0 days.

(21) Appl. No.: 09/918,525

(22) Filed: Aug. 1, 2001

(65) Prior Publication Data

US 2003/0025566 A1 Feb. 6, 2003

(51) Int. Cl.[7] .................................................. H03L 5/00
(52) U.S. Cl. ..................................... 331/109; 331/117 R
(58) Field of Search .............................. 331/109, 117 R, 331/117 FE, 175, 177 R, 177 V, 108, 117, 167

(56) References Cited

U.S. PATENT DOCUMENTS

| | | | | |
|---|---|---|---|---|
| 5,175,884 A | * | 12/1992 | Suarez | 331/177 R |
| 5,629,652 A | * | 5/1997 | Weiss | 331/108 B |
| 5,920,235 A | * | 7/1999 | Beards et al. | 331/108 D |
| 5,977,828 A | | 11/1999 | Hu et al. | 330/254 |
| 6,016,082 A | * | 1/2000 | Cruz et al. | 331/117 D |
| 6,046,647 A | * | 4/2000 | Nelson | 331/105 |
| 6,064,277 A | * | 5/2000 | Gilbert | 331/117 R |
| 6,281,758 B1 | * | 8/2001 | Elsayed et al. | 331/117 FE |
| 6,362,698 B1 | * | 3/2002 | Gupta | 330/310 |
| 6,404,293 B1 | * | 6/2002 | Darabi et al. | 331/37 |
| 6,411,171 B2 | * | 6/2002 | Itoh | 331/117 FE |
| 6,417,740 B1 | * | 7/2002 | Anh et al. | 331/117 FE |

FOREIGN PATENT DOCUMENTS

| | | |
|---|---|---|
| EP | 0899866 | 8/1998 |
| GB | 2349995 | 5/1999 |

* cited by examiner

*Primary Examiner*—Timothy P. Callahan
*Assistant Examiner*—Cassandra Cox

(57) ABSTRACT

A novel circuit topology which provides for the digital automatic gain control of a VCO is disclosed. The topology of the VCO is based on the negative transconductance oscillator due to its intrinsically simple biasing scheme. A system parameter sensitive to the performance level of the VCO is firstly measured. A digital control signal is then generated in response to the measured system parameter. The biasing current provided by the tail circuit of the VCO is adjusted based on the value of the digital control signal. In this way, the biasing current of the VCO may be adjusted to an optimal value for all frequencies of operation. The automatic control aspects of the present invention is useful in monolithic implementations since it automatically compensates for variations in load resistance, process parameters and component tolerances without requiring expensive manual adjustments at the board level.

16 Claims, 6 Drawing Sheets

AUTOMATIC GAIN CONTROL FOR A VOLTAGE CONTROLLED OSCILLATOR

FIELD OF THE INVENTION

This invention relates to voltage controlled oscillators (VCOs) and, more particularly, to a novel circuit topology which provides automatic gain control for a VCO.

BACKGROUND OF THE INVENTION

Due to the emergence of the mobile telecommunications market, the need for small, inexpensive, and low-power RF circuit components is paramount. By integrating more and more functions on the same die, single-chip transceivers are only now becoming a reality.

One of the major challenges in the design of an inexpensive transceiver system is frequency synthesis of the local oscillator signal. Frequency synthesis is usually done using a phase-locked loop (PLL). A PLL typically contains a phase detector, amplifier and a voltage-controlled oscillator (VCO). The feedback action of the loop causes the output frequency to be some multiple of a supplied reference frequency. This reference frequency is generated by the VCO whose output rate is variable over some range according to an input control voltage.

Despite numerous advances in the art, VCOs still remain as one of the most critical design components in RF transceivers. The most important parameters of a VCO are phase noise, power consumption and frequency tuning range. Specifically, it is of major importance to build low-power, low-phase-noise oscillators. This has only been possible with oscillators based on the resonance frequency of an inductor-capacitor (LC) tank circuit.

A perfectly lossless resonant circuit is very nearly an oscillator, but lossless elements are difficult to realize. Overcoming the energy loss implied by the finite Q of practical resonators with the energy supplying action of active elements is one potentially attractive way to build practical oscillators. The basic ingredients in all LC feedback oscillators, then, are simple: one transistor plus a resonator. In theory, there is no limit to the number of ways to combine a resonator with a transistor or two to make an oscillator.

In order to guarantee oscillation, the net resistance across the LC tank of an oscillator must be negative. This negative resistance is used to offset the positive resistance of all practical resonators, thereby overcoming the damping losses and reinforcing the oscillation. The negative transconductance ($-G_m$) oscillator uses a cross-coupled differential pair to synthesize the negative resistance.

The basic topology for the $-G_m$ oscillator is shown in FIG. 1. The oscillator may be viewed as consisting of three parts: an LC resonant tank, a negative resistance generation (positive feedback) network and a biasing network. Transistors Q1 and Q2 form a negative resistance generator in parallel with the LC tank that sets the frequency of oscillation. From the point of view of the LC tank, the active circuitry (transistors Q1 and Q2) cancels the losses due to the finite Q of the LC resonator tank. Varactors $C_{var}$ are used in place of fixed capacitors to provide a tuning scheme. The supply voltage $V_{cc}$ is fed into the circuit through the center tap of the symmetric differential inductor L. A single inductor is usually preferred in this implementation because of the superior quality factor Q and reduced chip area compared with using two inductors connected in series. Finally, in order to reduce the common-mode gain and maintain a constant total emitter current shared equally by the two collector circuits, a large emitter resistance must be realized. A constant current source It is typically used to simulate this high resistance (since large resistances are hard to fabricate on IC chips). The tail current It aids in controlling the swing of the oscillator and may be implemented with any of the common current generator circuits already in existence.

An important element reflecting the performance of VCOs is phase noise: instantaneous variations in the frequency of oscillation as determined by loss elements such as series resistances in the circuit. Variations in the amplitude of oscillation correspond to variations in phase noise as the total energy stored in the tank includes signal energy and noise energy. VCO operation is, therefore, susceptible to variations in the load resistance and component tolerances, as well as variations in the values of the inductor, the capacitor and their parasitic resistances, caused by semiconductor process variations.

The noise contributed by the active drive circuitry in FIG. 1 can be minimised by operating the LC tank circuit at a maximum attainable oscillation amplitude. This is because the total energy stored in the tank (which is a function of the peak voltage amplitude) includes both signal energy and noise energy. As the oscillation amplitude increases, the percentage of total energy attributed to noise from the drive circuit decreases, thereby reducing the phase noise of the oscillator. Therefore, it is desirable to produce the largest voltage swing possible across the tank.

However, the circuit in FIG. 1 cannot be used to generate large voltage swings across the tank circuit because the bases of transistors Q1 and Q2 are connected to the collectors of Q2 and Q1, respectively. If the voltage swing across the tank becomes too great, Q1 and Q2 are driven into saturation during peak voltage excursions of the tank thereby introducing additional phase noise into the oscillator. If the amplitude is increased further, the emitters of Q1 and Q2 might even breakdown. Therefore, trying to increase the amplitude of oscillation of the circuit in FIG. 1 above a certain bound is counterproductive because the saturation of the transistors introduces additional phase noise.

The limited voltage swing available from the oscillator of FIG. 1 aggravates its susceptibility to variations in load resistance because the circuit also requires a minimum tail current to start oscillation. The minimum tail current needed to start the oscillation is referred to as the critical factor. If the tail current is set to exactly the critical factor, the oscillator just barely begins to oscillate and then stops. Therefore, to obtain a sustainable oscillation, it is necessary for the tail current to be greater than the critical value. Depending on the value of the tail current selected, the oscillation amplitude settles to a steady state value. However, the amplitude must not be allowed to grow too large or the transistors will saturate as discussed above, thereby increasing the phase noise of the system. The tail current must be chosen within a small window between the critical factor and some maximum value, otherwise the oscillator will either fail to start or the transistors Q1 and Q2 will saturate.

In a board-level design, manual bias adjustments, although costly, can be made to drive the circuit so as to set the drive conditions to assure start-up and prevent saturation of the drive transistors. However, in a monolithic implementation, there is no opportunity for manual intervention. The oscillator must consistently meet its difficult specifications, not only over a wide range of supply voltage and temperature, but also in the presence of numerous parametric variances associated with the production of commercial integrated circuits, and perhaps for a variety of possibly different external (board-level) components. More importantly, in a wide tuning range oscillator, the loss in a particular component may vary at different frequencies of oscillation. A change in the loss of a component and associated change in the loss in the tank necessitates a change in the ideal current source for optimal biasing to be achieved. In other words, if the loss in the tank changes over the frequency of operation of the VCO, then so does the ideal biasing current. Without any feedback, there is no way to adjust the biasing current to an optimal value for all frequencies of operation.

If the load resistance and all of the other factors that affect the oscillation amplitude were known in advance, it would be possible to select a value of tail current that is greater than the critical value so as to assure the oscillator will start up and continue oscillating, but low enough to prevent the transistors form saturating. However, it is often impossible to know the actual value of the load resistance due to variations in temperature, load, processing etc. Therefore, since it is impossible to set the tail resistance over all temperature and process variations, some form of control circuitry to adjust the tail current is needed so as to provide a perfect bias for optimum performance. In this way, the susceptibility of an oscillator circuit to component tolerances and process variations may be reduced.

SUMMARY OF THE INVENTION

The present invention discloses a novel circuit topology providing for the digital automatic gain control of a voltage controlled oscillator (VCO). The topology of the present invention is based on the topology for the negative transconductance oscillator due to its intrinsically simple biasing scheme.

In accordance with a broad aspect of the present invention, a voltage controlled oscillator (VCO) is provided comprising a resonant tank circuit, cross-coupled first and second transistors connected to the resonant tank circuit and having a pair of commonly connected terminals, a tail circuit connected to the commonly connected terminals for providing bias current to the VCO and a control circuit connected to the tail circuit. The control circuit is adapted to generate a digital control signal in response to a measured system parameter sensitive to the performance level of the VCO. The digital control signal then adjusts the bias current provided by the tail circuit to maintain the oscillation amplitude of the VCO within a predetermined range.

In accordance with a further broad aspect of the present invention, a voltage controlled oscillator is provided as described above wherein the tail circuit comprises a plurality of resistors connected in parallel and wherein a plurality of corresponding switches are connected to the plurality of resistors. Each of the plurality of switches is arranged so as to be operable to switch its respective resistor into circuit with the cross-coupled first and second transistors.

In accordance with yet another broad aspect of the present invention, a method for digitally controlling the biasing current provided by a tail circuit of a VCO is provided, the method comprising generating a digital control signal in response to a measured system parameter sensitive to the performance level of the VCO and adjusting the biasing current provided by the tail circuit based on the value of the digital control signal.

The automatic control aspects of the present invention are especially useful in monolithic implementations because it automatically compensates for variations in load resistance, process parameters, component tolerances, and the like, without requiring expensive manual adjustments at the board level.

Other aspects and features of the present invention will become apparent to those ordinarily skilled in the art upon review of the following description of specific embodiments of the invention in conjunction with the accompanying drawings.

DESCRIPTION OF THE PREFERRED EMBODIMENTS

Figure 1:
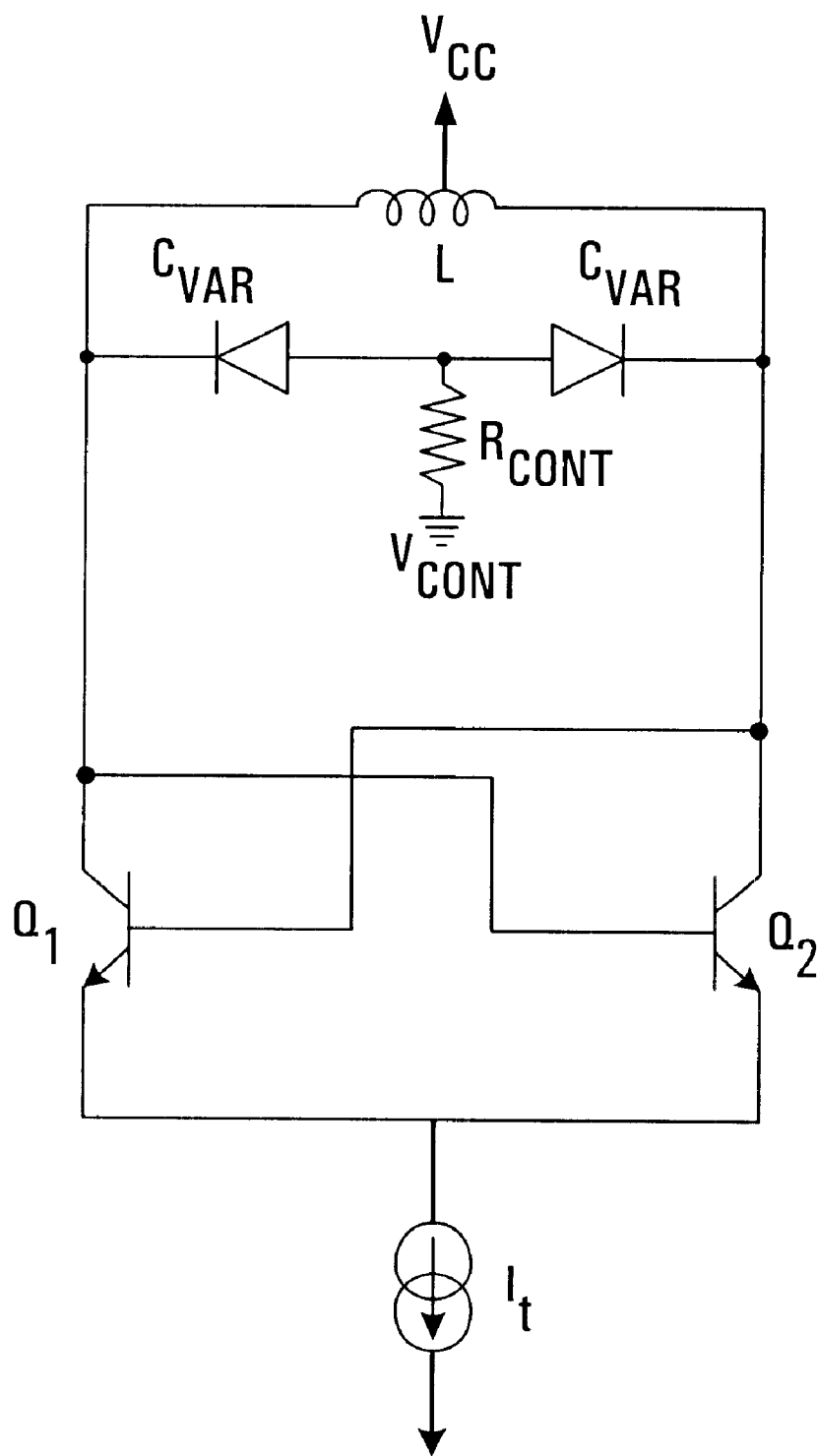
FIG. 1 depicts a conventional known topology for a negative transconductance ($-G_m$) voltage controlled oscillator (VCO).
Figure 2:
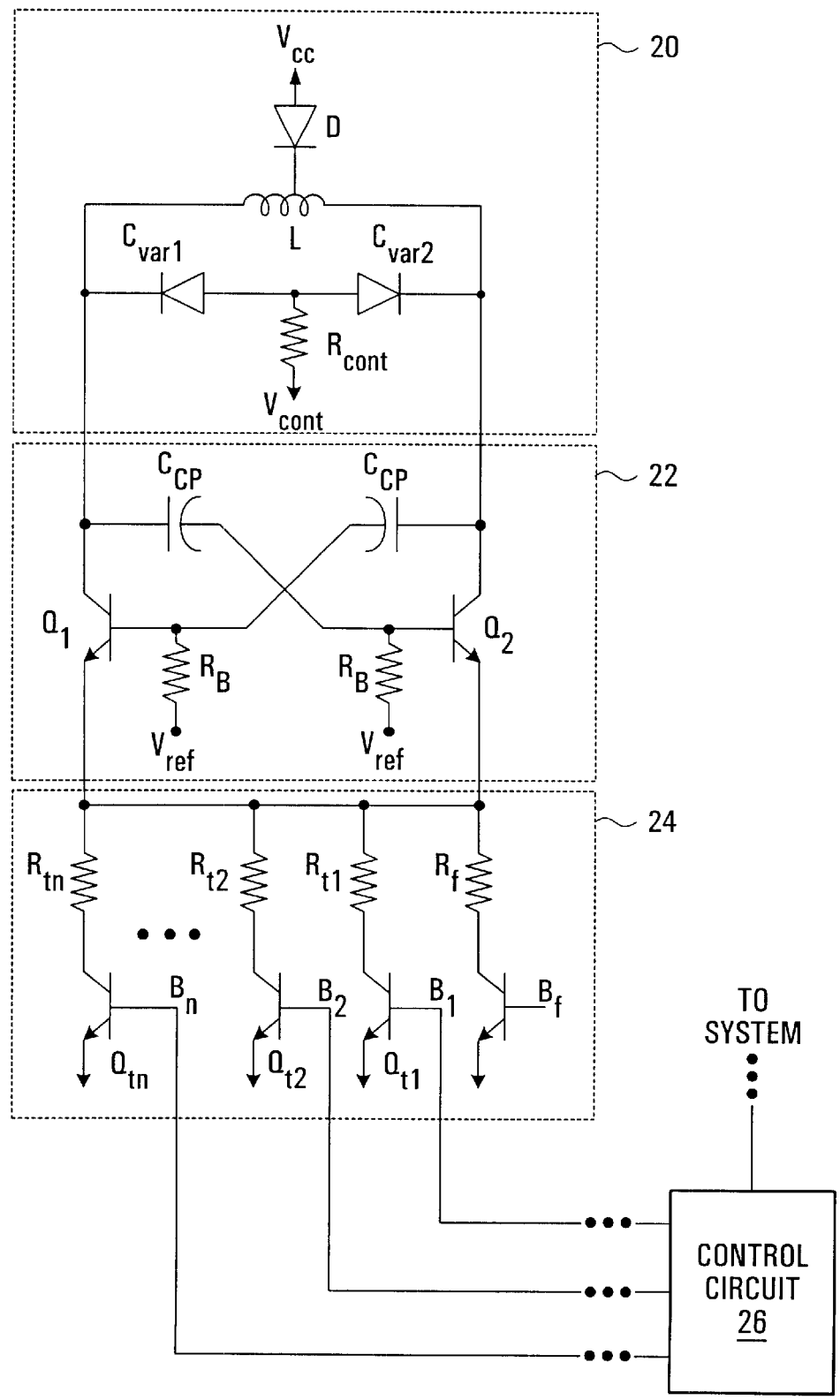
FIG. 2 is a schematic diagram of a VCO having digital automatic gain control according to a first general embodiment of the present invention.

FIG. 2 depicts the general circuit topology of a VCO comprising digital automatic gain control according to a first embodiment of the present invention. The topology of this VCO is based on the negative transconductance ($-G_m$) cross-coupled oscillator of FIG. 1 due to its intrinsically simple biasing scheme. 1 The oscillator may simply be viewed as consisting of four sections: an LC resonant tank 20, a negative resistance generation (or positive feedback) network 22, a tail circuit 24 and some form of control circuitry 26 feeding into the tail circuit 24.

The LC resonant tank 20 comprises a symmetric differential inductor L, a first varactor $C_{var1}$, a second varactor $C_{var2}$ and a control resistor $R_{cont}$. The cathode of the first varactor $C_{var1}$ is connected to one end of the inductor L while the cathode of the second varactor $C_{var2}$ is connected to the other end of the inductor L. The anodes of the varactors $C_{var1}$, $C_{var2}$ are tied together to one end of the control resistor $R_{cont}$, to whose other end is applied a bias control voltage $V_{cont}$. A supply voltage $V_{cc}$ operating as a first power rail is fed via a diode D into the circuit through the center tap of the symmetric differential inductor L.

Varactors (or variable capacitors) $C_{var1}$, $C_{var2}$ are used in place of fixed capacitors to provide a tuning scheme for the oscillator. Such capacitors may be provided by the junction capacitor formed with a p+ diffusion in an n-well, for example. Tuning of the effective capacitance is controlled with the application of an appropriate bias control voltage $V_{cont}$ at the control resistor $R_{cont}$. Furthermore, the diode D in series with the supply voltage $V_{cc}$ is included to provide enough headroom so that the full tuning range of the varactors $C_{var1}$, $C_{var2}$ may be exploited.

The negative resistance generation network 22 (or positive feedback network) comprises a first npn transistor Q1 and a second npn transistor Q2 arranged to form a cross-coupled differential pair. The npn transistors Q1, Q2 each consist of a collector terminal, a base terminal and an emitter terminal. The collector of transistor Q1 is connected through a first coupling capacitor $C_{cp}$ to the base of transistor Q2. Similarly, the collector of transistor Q2 is coupled through a second coupling capacitor $C_{cp}$ to the base of transistor Q1. The collector of transistor Q1 is also connected to the junction between the inductor L and the cathode of the first varactor $C_{var1}$. Likewise, the collector of transistor Q2 is connected to the junction between the inductor L and the cathode of the second varactor $C_{var2}$.

Transistors Q1 and Q2 form the negative resistance feedback network that provides gain to the LC tank and allows the oscillations to start. The bases of transistors Q1 and Q2 are each biased from some DC potential $V_{ref}$. However, a blocking resistor $R_B$ is placed in each bias path to avoid bleeding away RF power and stopping the oscillation. Note that biasing on the bases of Q1 and Q2 could be done in any number of ways and is unimportant to the current discussion.

The tail circuit 24 comprises a parallel combination of switched resistors $R_{t1} \ldots R_{tn}$ and a fixed resistor $R_f$. Any number 'n' of resistors and switches may be used. The tail circuit 24 takes the place of the current source $I_t$ in FIG. 1. In general, the use of resistors in the tail of a VCO tends to classify it as a sort of class B VCO analogous to the definition given to class B amplifiers. As those skilled in the art will appreciate, substitution of the current source in the tail of a VCO with resistors provides for several advantages. For example, better performance of the VCO may be achieved at a lower power i.e. more RF power for less DC power. In addition, the phase noise performance of the oscillator will generally tend to be better.

In the embodiment of FIG. 2, the tail resistors $R_{t1} \ldots R_{tn}$ are switched in and out with the use of a corresponding set of transistors $Q_{t1} \ldots Q_{tn}$. The transistors are merely an implementation detail as any switching device will do for the purpose.

In terms of operation, one or more of the transistors in the tail circuit 24 (i.e. one of $Q_{t1} \ldots Q_{tn}$ or $Q_{tf}$) must be saturated and, therefore, provide a short to ground. In the particular embodiment of FIG. 2, the fixed resistor $R_f$ is always left switched in via a closed transistor switch $Q_{tf}$. The remaining tail resistors that are connected to ground (or effectively switched in) will, in turn, set the bias point for the circuit. They will also provide a feedback mechanism to limit how much the signal grows.

It should be noted that having the fixed resistor $R_f$ always switched is merely out of convenience and is not an essential feature of the invention. For example, a tail circuit comprising only a set of switched resistors could, therefore, also be employed. Furthermore, the fixed resistor $R_f$ in FIG. 2 has a transistor switch $Q_{tf}$ associated with it for the purpose of matching this resistor to the other resistor-switch combinations as there will also be some voltage drop across each switch.

The control terminal of each switching transistor $Q_{tn} \ldots Q_{t1}$ receives a corresponding bit of a digital control signal $B_n \ldots B_2 B_1$ generated by the command/control circuitry 26. Specifically, the least significant bit $B_1$ is fed to the control terminal of switching transistor $Q_{t1}$ and so on and so forth with the most significant bit (MSB) $B_n$ feeding the control terminal of switching transistor $Q_{tn}$. In this way, the current and, therefore, performance of the VCO may be controlled by simple adjustment or manipulation of the digital control signal $B_n \ldots B_2 B_1$. For example, somewhere in a given communications system a particular property may be measured (e.g. bit error rate, VCO amplitude, conversion gain etc.) that is sensitive to the performance level of the VCO. The current in the VCO may then be adjusted accordingly via the command/control circuit 26 switching in the appropriate effective tail resistance.

If the tail resistance is too small then the oscillation amplitude will grow very large and must be limited to prevent saturation of the transistors Q1, Q2. On the other hand, if the tail resistance is too large, then the oscillation will have a small amplitude and, therefore, the phase noise will also suffer. Since it is impossible to set the tail resistance to one specific optimum value considering all temperature and process variations, the command/control circuitry 26 in FIG. 2 may be used to turn on or turn off one or more tail resistors to provide a perfect bias for optimum performance.

Figure 3:
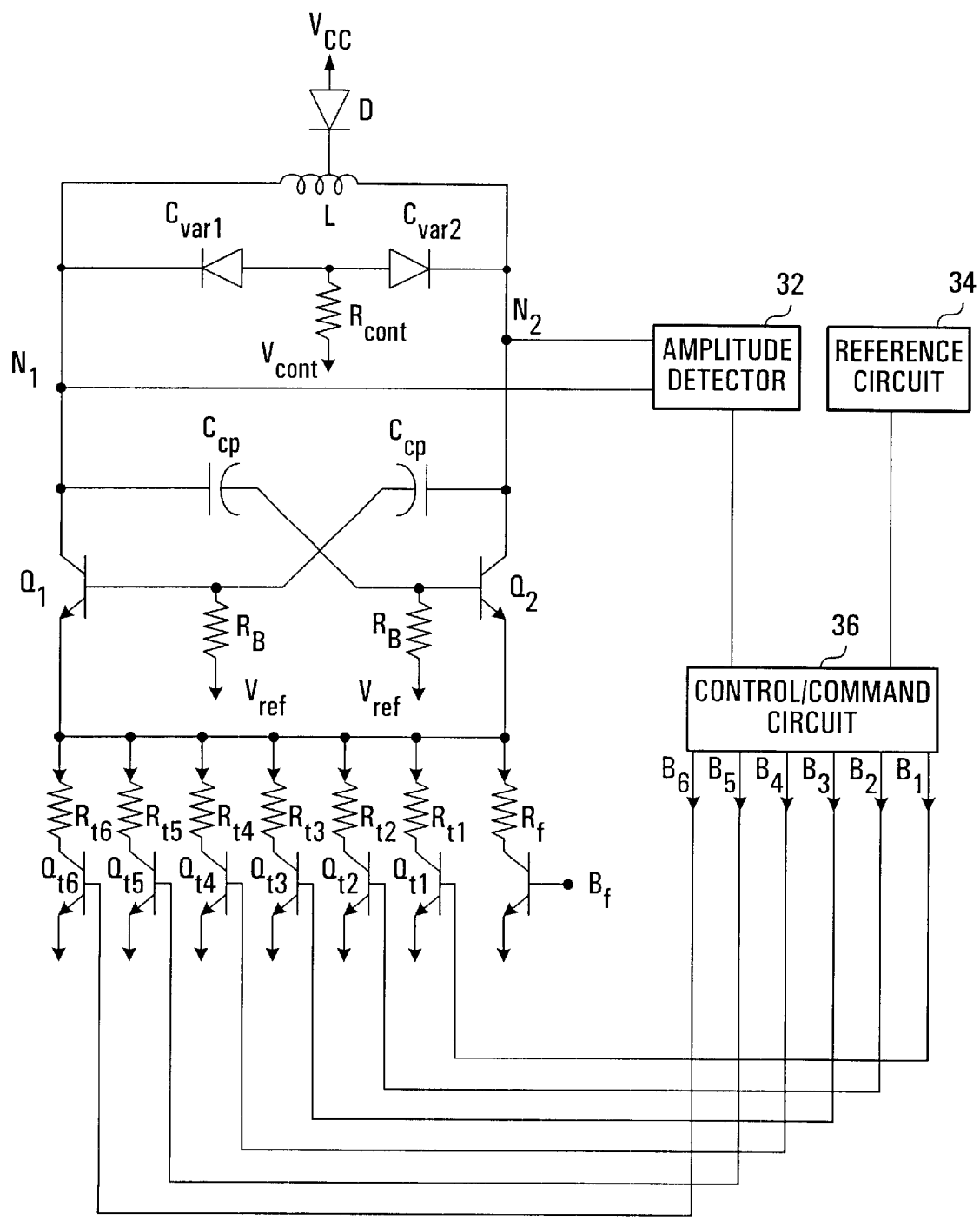
FIG. 3 depicts a practical VCO implementation comprising a digital automatic gain control circuit according to a second embodiment of the present invention.

As mentioned above, VCO amplitude is a system parameter that may be measured which is also sensitive to the performance level of a VCO. In light of this fact, the measured value may then be fed to some form of "intelligent" control circuitry which adjusts the effective tail resistance thereby controlling the bias current and, hence, performance level of the VCO. For example, FIG. 3 depicts a VCO implementation comprising a digital automatic gain control circuit according to a second embodiment of the present invention. The embodiment in FIG. 3 is based, for the most part, on the embodiment depicted in FIG. 2 and, as such like labels have been used to denote like components.

In this particular embodiment, six tail resistors $R_{t1} \ldots R_{t6}$ with corresponding switching transistors $Q_{t1} \ldots Q_{tm}$ are used in the tail circuit. As before the resistor $R_f$ is always left switched in. An amplitude detector circuit 32 is used to detect the amplitude of oscillation and is attached to the VCO at nodes N1 and N2. The output of the amplitude detector 32 and a corresponding reference circuit 34 is then feed into a control/command circuit 36 to determine the relative amplitude of oscillation and whether any adjustments need to be made. The control/command circuit 36 either turns on or turns off one or more tail resistors to provide a perfect bias for optimum performance. The tail resistors are switched in and out with the use of the transistors acting as switches. As a practical matter, any number of tail resistors may be employed to provide the desired resolution or step size for the current in the circuit, as will be seen.

With regards to implementation, the tail resistors $R_{t1} \ldots R_{t6}$ may advantageously be chosen to follow a "binary-weighted" scheme. For example, $R_{t1}=200\Omega$, $R_{t2}=400\Omega$, $R_{t3}=800\Omega$, $R_{t4}=1600\Omega$, $R_{t5}=3200\Omega$, $R_{t6}=6400\Omega$ with $R_f=450\Omega$. In this particular scheme, the resistors that are switched in will correspond to a particular binary number $B_6 B_5 \ldots B_1$. For example, the six resistor-switch combinations shown in FIG. 3 with $R_{t1}$ and $R_{t6}$ switched in, therefore, corresponds to the binary number 100001=33 (base 10). Using the resistance values $R_{t1}=200\Omega$, $R_{t6}=6400\Omega$ and $R_f=450\Omega$ and noting that the resistors are in parallel, a count number 33 (base 10) or binary output 100001 from the command/control circuit 36 will correspond to an equivalent tail resistance of approximately 135$\Omega$.

Figure 4:
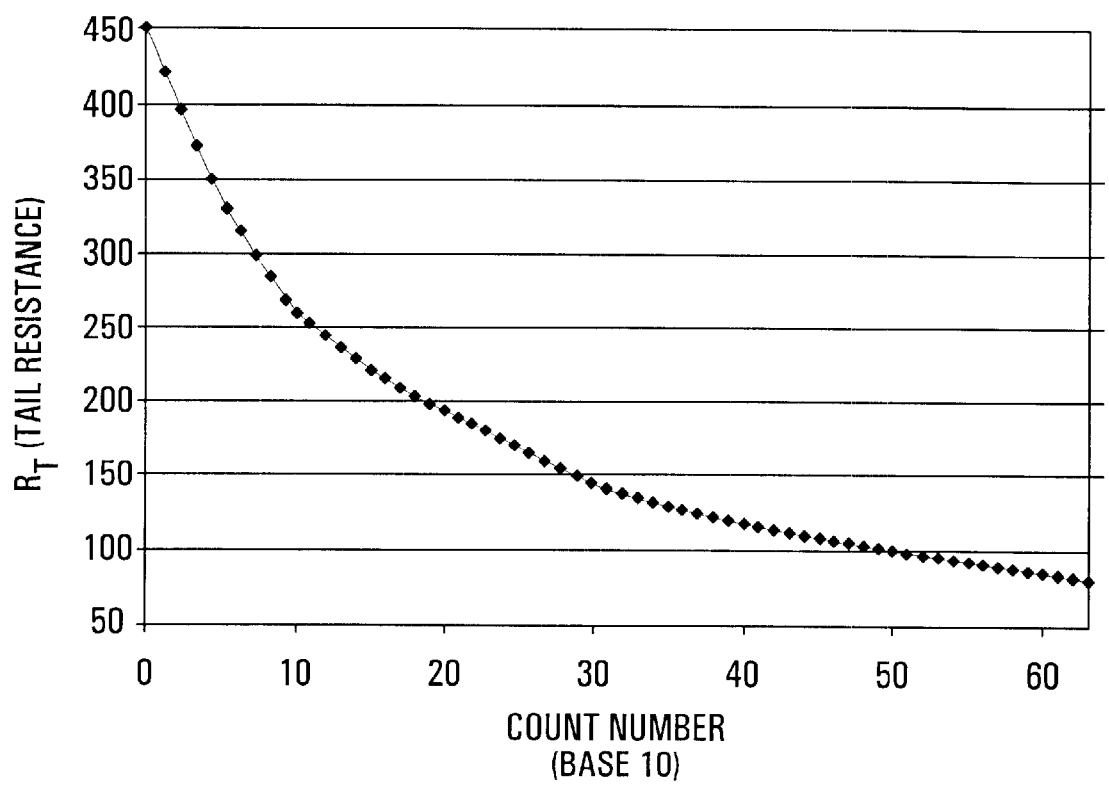
FIG. 4 is a graph of the effective tail resistance achievable over a predetermined range using the six-bit resolution for the VCO implementation of FIG. 3.

FIG. 4 is a plot of the value of total effective tail resistance $R_T$ corresponding to each possible binary output of the command/control circuit 36 of FIG. 3. The abscissa in FIG. 4 covers the range of decimal numbers 0 through 63 achievable using the six-bit output of the control/command circuit 36 while the ordinate defines the total effective tail resistance corresponding to the resistor combination defined by the output of the command/control circuit 36. As can be seen, the curve is relatively smooth and demonstrates the high tuning resolution achievable over the effective resistance range defined by the six switched resistors $R_{t1} \ldots R_{t6}$. It should be apparent, then, that the primary advantage of adding more resistors (or bits) in the tail of the VCO is greater tuning resolution. Furthermore, a range of resistance should be carefully chosen such that any variation in temperature, process, etc. will still allow for a tail resistance to be selected which provides optimum bias conditions. The number of tail resistors is chosen, therefore, to give good resolution over the pre-determined range.

While advantageous since they yield a smooth transition curve as depicted in FIG. 4, it should be noted that the switched resistors in the tail circuit of a VCO in accordance with the present invention do not generally have to follow a binary-weighted scheme. In fact, any of an infinite number of other resistor schemes is quite possible and may even be preferable depending on the application. Furthermore, it should be apparent to those skilled in the art that the switched resistors in the tail circuit may alternatively be replaced by a suitable implementation of a switched current source. In such a case, the current source would then have to be digitally adjustable.

Figure 5A:
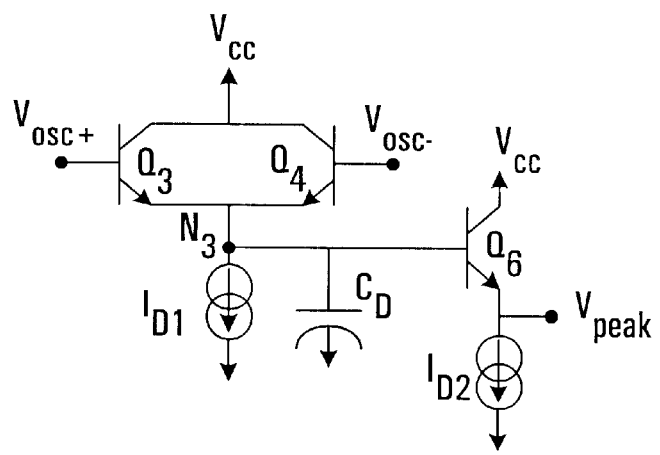
FIG. 5*a* is a schematic diagram of an example amplitude detector circuit which may be used in accordance with the embodiment of FIG. 3.

FIG. 5a is a schematic diagram of a fairly standard peak detector circuit which may be used to implement the amplitude detector circuit 32 of FIG. 3. Peak detector circuits are fairly well known in the art and generally comprise an input amplifier stage, a capacitor $C_D$ and a voltage-follower stage.

Referring to FIG. 5a, the input amplifier stage comprises a pair of differential emitter-coupled common-emitter amplifier transistors Q3 and Q4 whose respective collectors are tied together to the supply voltage $V_{cc}$. The emitters of transistors Q3 and Q4 are coupled at a node D1 and are connected to ground via a constant current source $I_{D1}$. The input amplifier stage also has two differential inputs $V_{osc+}$ and $V_{osc-}$ which are connected to nodes N1 and N2, respectively, of the VCO in FIG. 3. The capacitor $C_D$ is placed in parallel with the current source $I_{D1}$ and is connected between ground and node N3. Finally, the voltage follower comprises a transistor Q6 having its collector tied to the supply voltage $V_{cc}$ and its emitter grounded via a constant current source $I_{D2}$. The base of transistor Q6 receives its signal from the emitter-coupling at node N3. The junction between the emitter of transistor Q6 and the constant current source $I_{D2}$ then corresponds to a voltage $V_{peak}$ which may be used as a measure of the relative VCO amplitude.

The measured VCO amplitude may subsequently be used to provide feedback for adjusting the tail resistance. For example, using the peak detector circuit of FIG. 5a in the particular embodiment of FIG. 3, the VCO signal may be tapped off at nodes N1 and N2 and delivered to the differential pair of inputs $V_{osc+}$ and $V_{osc-}$. As the VCO amplitude reaches the top of its swing, the capacitor $C_D$ is charged up to a voltage that is one base-emitter junction voltage ($V_{be}$) less than the peak value of the VCO swing. This will also be one $V_{be}$ less than the supply $V_{cc}$ when the VCO swing is one $V_{be}$ peak. This will be the operating point of the circuit. The voltage follower stage then drops the voltage by another $V_{be}$. Therefore, the top of the ideal range for the output of the peak detector $V_{peak}$ is approximately 2 $V_{be}$ below the supply $V_{cc}$.

Figure 5B:
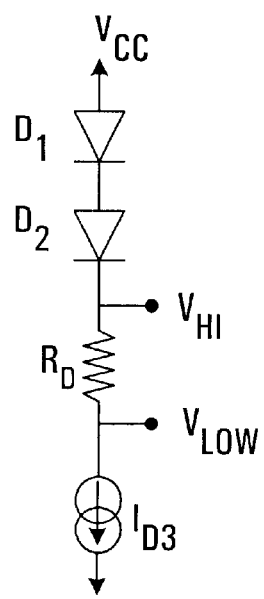
FIG. 5*b* is a schematic diagram of an example reference circuit which may be used in accordance with the embodiment of FIG. 3.

To define an optimal operating range for the VCO amplitude, the reference circuitry in FIG. 5b may be used. This reference circuit may correspond, for example, to the reference circuit 34 depicted in FIG. 3. Referring to FIG. 5b, the reference circuit comprises two series diodes D1 and D2 connected at one end to the supply voltage $V_{cc}$ and at the other end to a resistor $R_D$, which is then terminated to ground via a constant current source $I_{D3}$. An upper reference voltage $V_{HI}$ corresponding to the top of the ideal range for the output of the peak detector is generated by the drop across the two diodes D1 and D2. Some more voltage (e.g. about 150 mV) is then dropped across the resistor $R_D$ to give a lower reference voltage $V_{LOW}$, thereby yielding a predetermined range of acceptable values for the VCO amplitude. A little range is needed here or the circuit will be unstable trying to settle on one exact value. Furthermore, the VCO amplitude can only be set to within some tolerance since finite resolution is present.

The circuitry in FIGS. 5a and 5b only correspond to example embodiments for the amplitude detector 32 and reference circuit 34 of FIG. 3. However, continuing on with this implementation, these two circuits will yield a measured VCO oscillation amplitude $V_{peak}$ and two reference values $V_{HI}$ and $V_{LOW}$. A comparison of these signals may then be made to yield one of two digital control signals: 'VCO amplitude too high' or 'VCO amplitude too low'.

Figure 6:
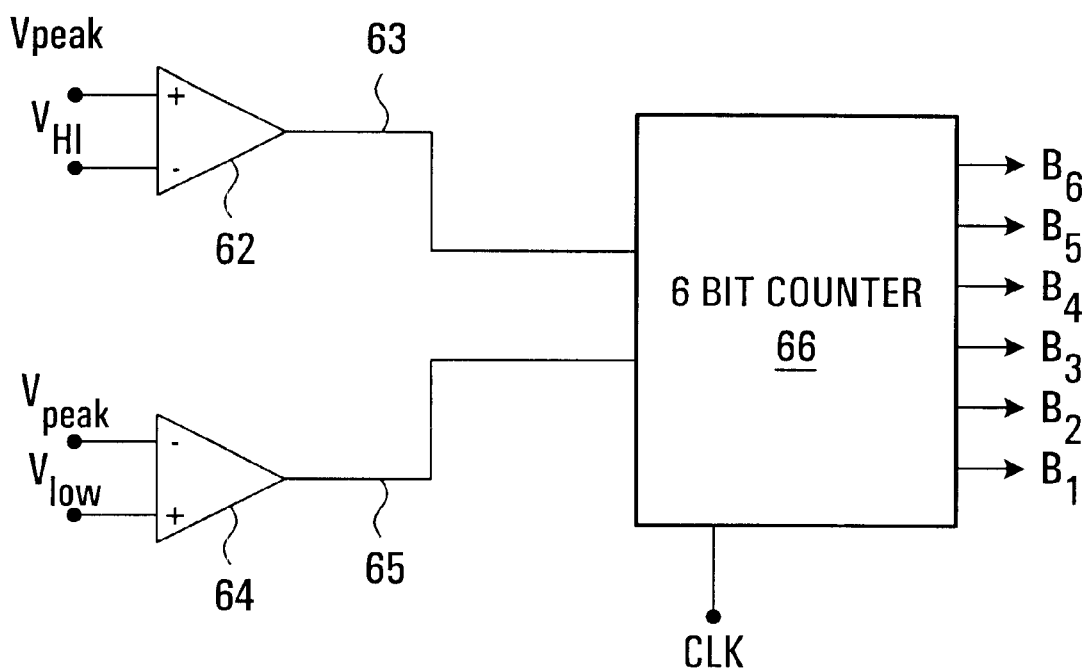
FIG. 6 is an example implementation of digital control/command circuitry which may be used to adjust the VCO tail resistance.

FIG. 6 is a schematic diagram of well known digital control circuitry which may be used to perform the above amplitude comparison. This circuitry may, for example, correspond to the control/command circuit 36 of FIG. 3. The circuitry in FIG. 6 comprises two high gain op-amps 62, 64 serving as comparators whose outputs 63, 65 are used as digital entries into a 6-bit up/down counter 66. The 6-bit up/down counter 66 is clocked, as shown, by a signal CLK and produces an output binary signal $B_6B_5B_4B_3B_2B_1$. The counter's six-bit output $B_6B_5B_4B_3B_2B_1$ is then fed to the corresponding control terminals of the respective switching transistors $Q_{t1} \ldots Q_{t6}$ in the tail of the VCO of FIG. 3.

In terms of operation, the three analog outputs of the peak detector circuit (FIG. 5a) and reference circuit (FIG. 5b) i.e. $V_{peak}$, $V_{HI}$ and $V_{LO}$ are used as inputs to the two op-amps 62, 64. The signals $V_{peak}$ and $V_{HI}$ are fed into op-amp 62 while the signals $V_{peak}$ and $V_{LO}$ are fed into op-amp 64. A positive output for op-amp 62 corresponds to a "count-down" signal while a positive output for op-amp 64 corresponds to a "count-up" signal. Each op-amp output 63, 65 is fed into the 6-bit up/down counter 66 which counts up or down within the binary range 000000 through 111111 corresponding to the decimal range 0 to 63. Note that the counter 66 is not made to cycle i.e. if it receives a "count-up" signal and it is already at 63 then it does nothing. The explicit details concerning the operation and design of such a counter are the subject of an undergraduate course and will not be dwelled upon further. Furthermore, the up/down counter 66 in this implementation should be a synchronous circuit and the clock signal CLK should be slower than the settling time of the oscillator.

If the measured VCO oscillation amplitude $V_{peak}$ indicated at the output of the peak detector is too high (i.e. above the predetermined reference value $V_{HI}$ provided by the reference circuit in FIG. 5b) the op-amp 62 signals the up/down counter 66 to start decrementing its count toward zero. Decreasing the count corresponds to a tail resistor combination having less high-value resistors switched in than the previous combination. Since the tail resistors are all in parallel, this causes an increase in the total effective tail resistance $R_T$ of the VCO thereby resulting in a reduction of the oscillation amplitude.

In a similar manner, if the measured VCO oscillation amplitude $V_{peak}$ is too low (i.e. less than the predetermined lower reference value $V_{LOW}$ provided by the reference circuit in FIG. 5b) the op-amp 64 signals the up/down counter 66 to start incrementing the count towards 63 (base 10). An increasing count value corresponds to switching in a combination of tail resistors effecting a decrease in the total effective tail resistance $R_T$ of the VCO thereby resulting in an increase in the oscillation amplitude. The effect of an increasing or decreasing count at the output of the up/down counter 66 on the total effective resistance switched into the tail of the VCO can likewise be seen with reference to FIG. 4.

Referring back to the general embodiment depicted in FIG. 2, the diode D in the $V_{CC}$ line is included to provide enough voltage drop to allow the varactors $C_{var1}$, $C_{var2}$ to experience their full tuning range. The diode D could, alternatively, be removed. Similarly, the collectors of transistors Q1 and Q2 comprising the cross-coupled pair are AC coupled to the bases of transistors Q2 and Q1 respectively. However, any element that provides an AC short circuit and a DC open circuit may, in fact, be substituted for the coupling capacitors $C_{cp}$. For example, this AC coupling could alternatively be implemented through the use of a transformer. However, if coupling capacitors $C_{cp}$ are used, they should be chosen large enough so as to provide lots of feedback around the cross-coupled pair Q1, Q2. Care should be taken since if they are chosen too large, the parasitic capacitance to the substrate will cause an unacceptable amount of signal loss. As previously mentioned, biasing on the bases could also be done in any number of ways.

As a final note, the circuit topology of the present invention has been illustrated only using bipolar technology. However, as will be apparent to those skilled in the art, this is merely a matter of preference to the designer. Indeed, a transistor is simply a controllable current source and the invention, like all RF circuits, may be implemented in any such accomodating technology. Accordingly, the topology of the present invention may alternatively be implemented using CMOS, GaAs, MESFETs, JFETs, or any other technology that provides suitable voltage-controlled or current-controlled current sources.

While preferred embodiments of the invention have been described and illustrated, it will be apparent to one skilled in the art that numerous modifications, variations and adaptations may be made without departing from the scope of the invention as defined in the claims appended hereto.

What is claimed is:

1. A voltage controlled oscillator (VCO) comprising:
    a resonant tank circuit;
    cross-coupled first and second transistors connected to the resonant tank circuit and having a pair of commonly connected terminals;
    a tail circuit connected to the commonly connected terminals for providing bias current to the VCO wherein the tail circuit comprises a plurality of switches connected in parallel; and
    a control circuit connected to the plurality of switches in the tail circuit, the control circuit adapted to generate a digital control word in response to a measured system parameter sensitive to the performance level of the VCO, the digital control word comprising a plurality of bits coupling respectively to the plurality of switches and the value of each bit determining whether the corresponding switch is on or off thereby adjusting the bias current provided by the tail circuit to maintain the oscillation amplitude of the VCO within a predetermined range.

2. A voltage controlled oscillator according to claim 1 wherein the tail circuit comprises a plurality of resistors connected in parallel and wherein the plurality of corresponding switches are connected to the plurality of resistors, each of the plurality of switches being arranged so as to be operable to switch its respective resistor into circuit with the cross-coupled first and second transistors.

3. A voltage controlled oscillator according to claim 2 wherein the plurality of resistors in the tail circuit have binary-weighted values and wherein the digital control word generated by the control circuit is used to switch in one or more resistors in the tail circuit.

4. A voltage controlled oscillator according to claim 1 wherein the cross-coupled first and second transistors are bipolar npn transistors, each transistor having a collector terminal, an emitter terminal and a base terminal.

5. A voltage controlled oscillator according to claim 4 wherein the commonly connected terminals of the cross-coupled first and second transistors comprise the emitter terminals.

6. A voltage controlled oscillator according to claim 4 wherein the base terminal of the first cross-coupled transistor is connected to the collector terminal of the second cross-coupled transistor by means of a first coupling capacitor and the base terminal of the second cross-coupled transistor is connected to the collector terminal of the first cross-coupled transistor by means of a second coupling capacitor.

7. A voltage controlled oscillator according to claim 4 wherein the base terminal of the first cross-coupled transistor is AC coupled to the collector terminal of the second cross-coupled transistor and the base terminal of the second cross-coupled transistor is AC coupled to the collector terminal of the first cross-coupled transistor.

8. A voltage controlled oscillator according to claim 2 wherein the plurality of switches connected to the plurality of resistors in the tail circuit of the VCO are bipolar npn transistors.

9. A voltage controlled oscillator according to claim 2 wherein the plurality of switches connected to the plurality of resistors in the tail circuit of the VCO are CMOS transistors.

10. A voltage controlled oscillator according to claim 1 wherein the resonant tank circuit comprises an inductive element and a capacitive element.

11. A voltage controlled oscillator according to claim 10 wherein the capacitive element comprises first and second varactor diodes each having a cathode terminal and an anode terminal, the anodes of the first and second varactor diodes coupled together and connected to a control voltage by means of a resistive element, the capacitance of the capacitive element being variable by adjusting the control voltage.

12. A voltage controlled oscillator according to claim 2 further comprising:
    a peak detector circuit connected to the resonant tank circuit for measuring the oscillation amplitude of the VCO;
    a reference circuit for generating an upper reference voltage and a lower reference voltage thereby defining a predetermined range for to VCO oscillation amplitude; and
    wherein the control circuit is adapted to generate the digital control word based on the measured oscillation amplitude and the upper and lower reference voltages generated by the reference circuit.

13. A voltage controlled oscillator according to claim 12 wherein the control circuit comprises:
- first comparator for comparing the measured oscillation amplitude with the upper reference voltage;
- a second comparator for comparing the measured oscillation amplitude with the lower reference voltage;
- a counter adapted to generate the digital control word based on the outputs of the first and second comparators.

14. A method for digitally controlling the bias current provided by a tail circuit in a VCO, the VCO comprising a resonant tank circuit, cross-coupled first and second transistors for driving the tank circuit and a tail circuit for biasing the cross-coupled first and second transistors, the tail circuit comprises a plurality of switches connected in parallel, the method comprising generating a digital control word, the digital control word comprising a plurality of bits coupling respectively to the plurality of switches and the value of each bit determining whether the corresponding switch is on or off thereby adjusting the bias current provided by the tail circuit based on the value of said digital control word, wherein the digital control word generated in response to a measured system parameters sensitive to the performance level of the VCO.

15. A method according to claim 14 further comprising the steps of:
- measuring the oscillation amplitude of the VCO;
- generating digital control word responsive to the measured oscillation amplitude of the VCO;
- adjusting the bias current in the tail circuit in response to the digital control word thereby maintaining the oscillation amplitude of the VCO within a predetermined range.

16. A method according to claim 15 wherein the bias current in the tail circuit is adjusted so as to provide an optimal bias for optimum performance of the VCO.

* * * * *